(12) United States Patent
Lee et al.

(10) Patent No.: US 6,501,302 B1
(45) Date of Patent: Dec. 31, 2002

(54) SINGLE-INPUT/DUAL-OUTPUT SENSE AMPLIFIER

(75) Inventors: Kyung T. Lee, Santa Clara, CA (US); Jason M. Hart, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/977,770

(22) Filed: Oct. 15, 2001

(51) Int. Cl.$^7$ ............................................. G01R 15/00

(52) U.S. Cl. .......................................... 327/55; 327/57

(58) Field of Search ........................ 327/50–52, 55–57; 365/203, 207

(56) References Cited

U.S. PATENT DOCUMENTS

| | | | |
|---|---|---|---|
| 4,567,387 A | | 1/1986 | Wacyk ........................ 327/51 |
| 5,228,106 A | * | 7/1993 | Ang et al. ..................... 327/57 |
| 5,627,789 A | * | 5/1997 | Kalb, Jr. ....................... 365/205 |
| 5,949,256 A | * | 9/1999 | Zhang et al. .................. 327/57 |
| 6,005,816 A | | 12/1999 | Manning et al. ............. 365/208 |
| 6,288,575 B1 | | 9/2001 | Forbes ........................ 327/57 |

OTHER PUBLICATIONS

Tegze P. Haraszti, "CMOS Memory Circuits," Kluwer Academic Pub., 2000; pp. 217–218 (3 pages total).

* cited by examiner

Primary Examiner—Terry D. Cunningham
Assistant Examiner—Long Nguyen
(74) Attorney, Agent, or Firm—Rosenthal & Osha L.L.P.

(57) ABSTRACT

A single-input/dual output sense amplifier includes cross-coupled transistors connected to a reference voltage; a first input transistor and a second input transistor connected to the cross-coupled transistors, wherein the first input transistor is coupled to a single input bit-line and the second input transistor is coupled to a reference voltage; an inverter receiving the input bit-line signal and outputting a complement of the input bit-line signal; a control circuit coupled to the second input transistor and receiving the complement of the input bit-line signal, wherein the cross-coupled transistors produce dual differential outputs. A method of producing dual differential output signals from a single input signal includes receiving a single input bit-line signal; inverting the received single input bit-line signal to produce the complement of the received single input bit-line signal; controlling the charging and discharging of a reference node based on the complement of the received input bit-line signal; and outputting dual differential output signals based on the single input bit-line signal and the reference node.

17 Claims, 3 Drawing Sheets

SINGLE-INPUT/DUAL-OUTPUT SENSE AMPLIFIER

BACKGROUND OF THE INVENTION

In computer and information processing systems, various integrated circuit chips must communicate digitally with each other over common buses. The differential sense amplifier is well known to provide a fast bit-line sensing mechanism in CMOS (complementary metal-oxide semiconductor) memory circuits such as SRAM (static random access memory), ROM (read only memory), PROM (programmable read only memory), and register files.

Differential sense amplifiers detect the difference between two input signals, referred to as the differential inputs. Typically, these input signals are a received signal and the inverse of the received signal. The differential sense amplifier senses the difference between the two input signals and determines the state of the received signal. Differential sense amplifiers have the advantage of good sensitivity, i.e., almost zero setup time and a specific hold time.

Differential sense amplifiers provide full-swing output signals by sensing small voltage (or current) differences between the dual input signals. As can be seen in FIG. 1, a differential sense amplifier (10) includes cross-coupled pmos transistors (12) and (14) and nmos transistors (16) and (18). These cross-coupled transistors (12), (14), (16), (18) are connected to reference voltage ($V_{DD}$) and enabled using transistor (28). Transistor (28) is also connected to ground and receives the sense amplifier enable control signal (sae). The input bit-line signals (bt) and (bt_n) are received by the differential sense amplifier (10) through transistors (20) and (22) respectively. These transistors (20) and (22) also receive a column select signal (cs) and are coupled to the cross-coupled transistors (12), (14), (16), (18).

When enabled by transistor (28), there is a differential voltage across the cross-coupled transistors (12), (14), (16), (18). The cross-coupled transistors (12), (14), (16), (18) amplify even small voltage differences between the inputs because of the positive feedback mechanism employed. Thus, a full swing (0 to $V_{DD}$, or vice-versa) can be realized on the differential output lines (out) and (out_n). Differential sense amplifiers are well suited for large memory circuits, whose number of entries is around 128 or more, because the area overhead of the differential sense amplifier is relatively small compared to the whole circuit area in such cases.

The output signals (out) and (out_n) are fed out of the differential sense amplifier (10) through inverters (24) and (26) respectively. Additionally, a recovery circuit (30) may be included at the inputs (bt) and (bt_n). Recovery circuit (30) is made up of two p-channel transistors (31) and (33) that are coupled together and connected to a reference voltage $V_{DD}$. The recovery circuit (30) is for precharging to $V_{DD}$ the lines on which input bit-line signals (bt) and (bt_n) are received. This precharging readies the lines for evaluation of the input signals (bt) and (bt_n). When the evaluation starts, the recovery circuit signal (rec) shuts off the precharge path from $V_{DD}$.

SUMMARY OF THE INVENTION

In general, in accordance one or more embodiments of the present invention, a single-input/dual output sense amplifier comprises cross-coupled transistors connected to a reference voltage; a first input transistor and a second input transistor connected the cross-coupled transistors; the first input transistor coupled to a single input bit-line; the second input transistor coupled to a reference voltage; an inverter receiving the input bit-line signal and outputting a complement of the input bit-line signal; a control circuit coupled to the second input transistor and receiving the complement of the input bit-line signal; and dual differential outputs.

In general, in accordance one or more embodiments of the present invention, a method of producing dual differential output signals from a single input signal comprises receiving a single input bit-line signal; inverting the received single input bit-line signal to produce the complement of the received single input bit-line signal; controlling the charging and discharging of a reference node based on the complement of the received input bit-line signal; and outputting dual differential output signals.

In general, in accordance one or more embodiments of the present invention, an apparatus for producing dual differential output signals from a single input signal comprises means for receiving a single input bit-line signal; means for inverting the received single input bit-line signal to produce the complement of the received single input bit-line signal; means for controlling the charging and discharging of a reference node based on the complement of the received input bit-line signal; and means for outputting dual differential output signals In general, in accordance one or more embodiments of the present invention, a single-input/dual output sense amplifier comprises cross-coupled transistors connected to a reference voltage and enabled by an enable transistor, the cross-coupled transistors comprising a first pmos transistor and second pmos transistor and a first nmos transistor and second nmos transistor; the enable transistor connected to ground and receiving a sense amplifier enable control signal; a first input transistor and a second input transistor connected the cross-coupled transistors and receiving a column select signal; the first input transistor coupled to a single input bit-line; the second input transistor coupled to a reference voltage; an inverter receiving the input bit-line signal and outputting a complement of the input bit-line signal; a control circuit coupled to the second input transistor and receiving the complement of the input bit-line signal and the column select signal; and dual differential outputs.

Other aspects and advantages of the invention will be apparent from the following description and the appended claims.

DETAILED DESCRIPTION

Figure 1:
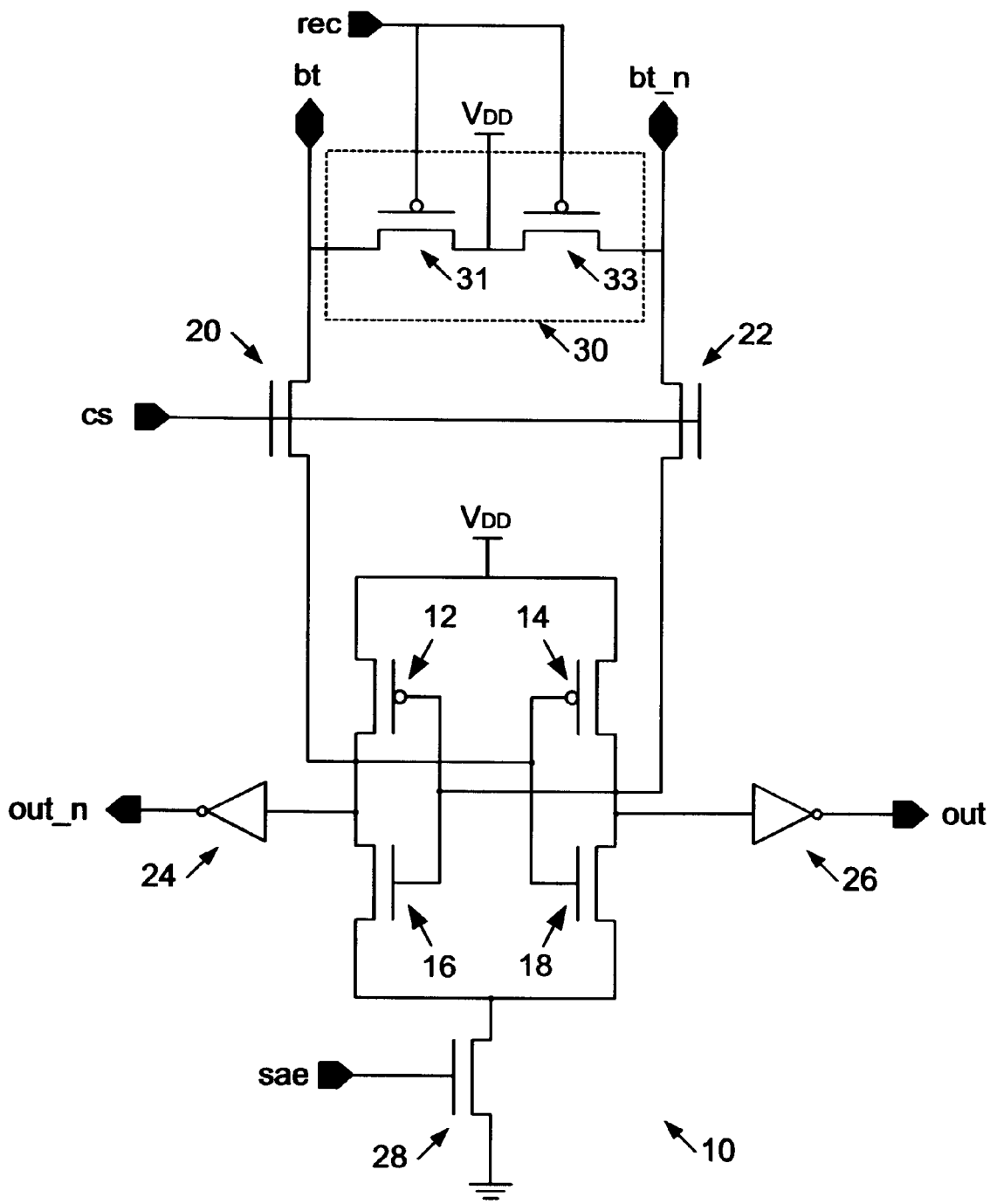
FIG. 1 is a circuit diagram of a conventional differential sense amplifier.

Generally, one or more embodiments of the present invention involve a single-input/dual-output sense amplifier that senses only one input signal and provides dual outputs. Embodiments of the present invention are presented below with reference to the drawing, wherein like reference numbers are used for like parts throughout the figures.

Figure 2:
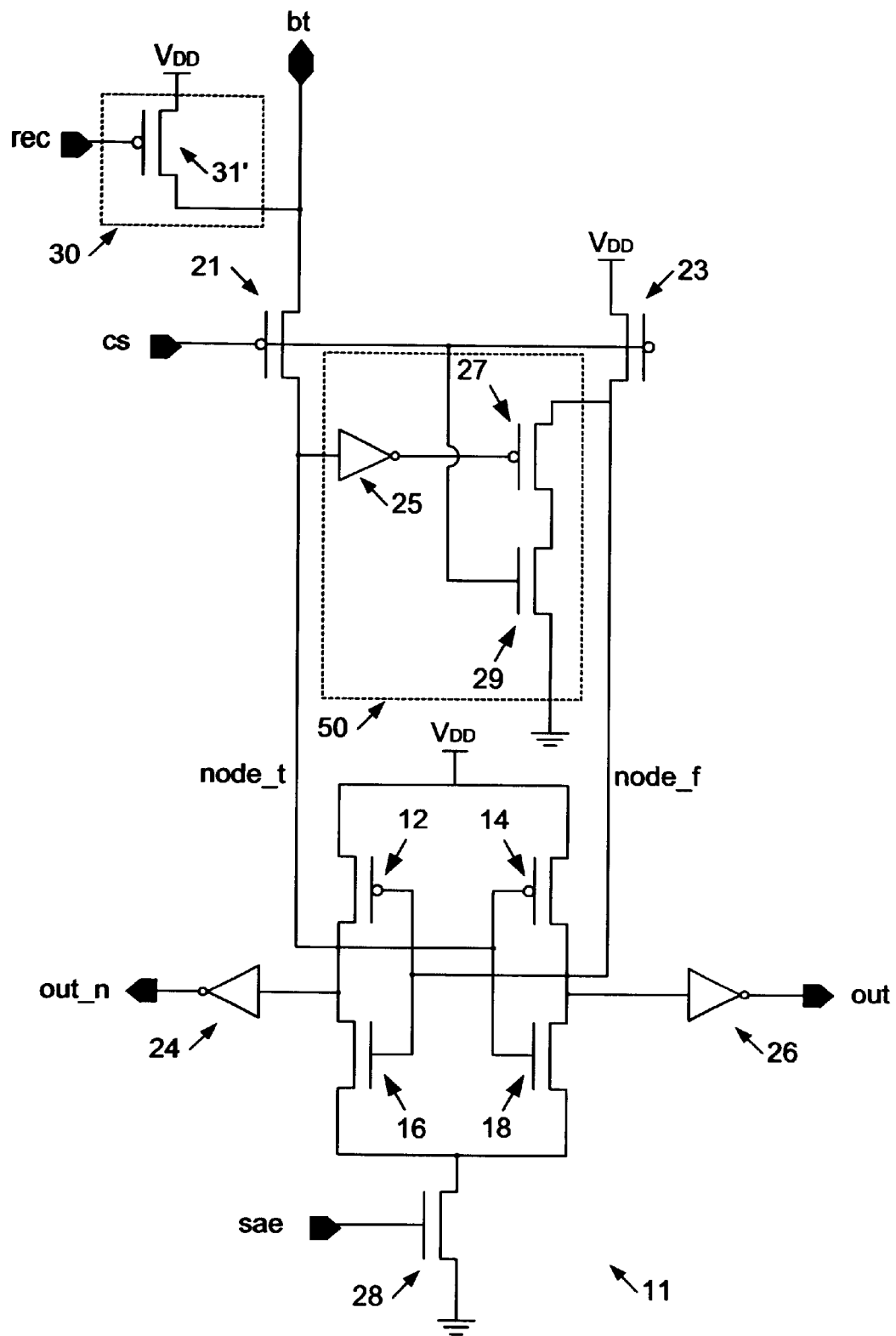
FIG. 2 is a circuit diagram of a single-input/dual-output sense amplifier in accordance with an embodiment of the present invention.

Referring to FIG. 2, a single-input/dual-output sense amplifier (11) in accordance with an embodiment of the present invention is shown. As can be seen, the single-input/dual-output sense amplifier (11) includes cross-coupled pmos transistors (12) and (14) and nmos transistors (16) and (18). These cross-coupled transistors (12), (14), (16), (18) are connected to reference voltage ($V_{DD}$) and enabled using transistor (28). Transistor (28) is also connected to ground and receives the sense amplifier enable control signal (sae).

A single input bit-line (bt) is received by the single-input/dual-output sense amplifier through pmos transistor (21). Because only one input bit-line signal (bt) comes into the single-input/dual-output sense amplifier, the recovery circuit (30') needs only to include one transistor (31'). The other input pmos transistor (23) is connected to reference voltage ($V_{DD}$) and will be referred to below as the reference node. These transistors (21) and (23) also receive the column select signal (cs) and are coupled to the cross-coupled transistors (12), (14), (16), (18). Further, an inverter (25) passes the input bit-line signal (bt) as its complement (bt__n) to a control circuit (50). In the embodiment shown, the control circuit (50) is a pair of transistors (27) and (29). These transistors, pmos transistor (27) and nmos transistor (29), are coupled between the reference node and ground. Additionally to the output of inverter (25), the coupled transistors (27) and (29) receive the column select signal (cs).

The single-input/dual-output sense amplifier uses inverter (25) to internally produce the complement (bt__n) of the input bit-line signal (bt). The inverter (25), in turn, controls charging and discharging of the referenced node through coupled transistors (27) and (29). When enabled by transistor (28), the cross-coupled transistors (12), (14), (16), (18) amplify the voltage difference between the input bit-line signal (bt) and referenced node. Thus, a full swing (0 to $V_{DD}$, or vice-versa) can be realized on the output lines (out) and (out__n). The output signals (out) and (out__n) are fed out of single-input/dual-output sense amplifier (11) through inverters (24) and (26) respectively.

Figure 3:
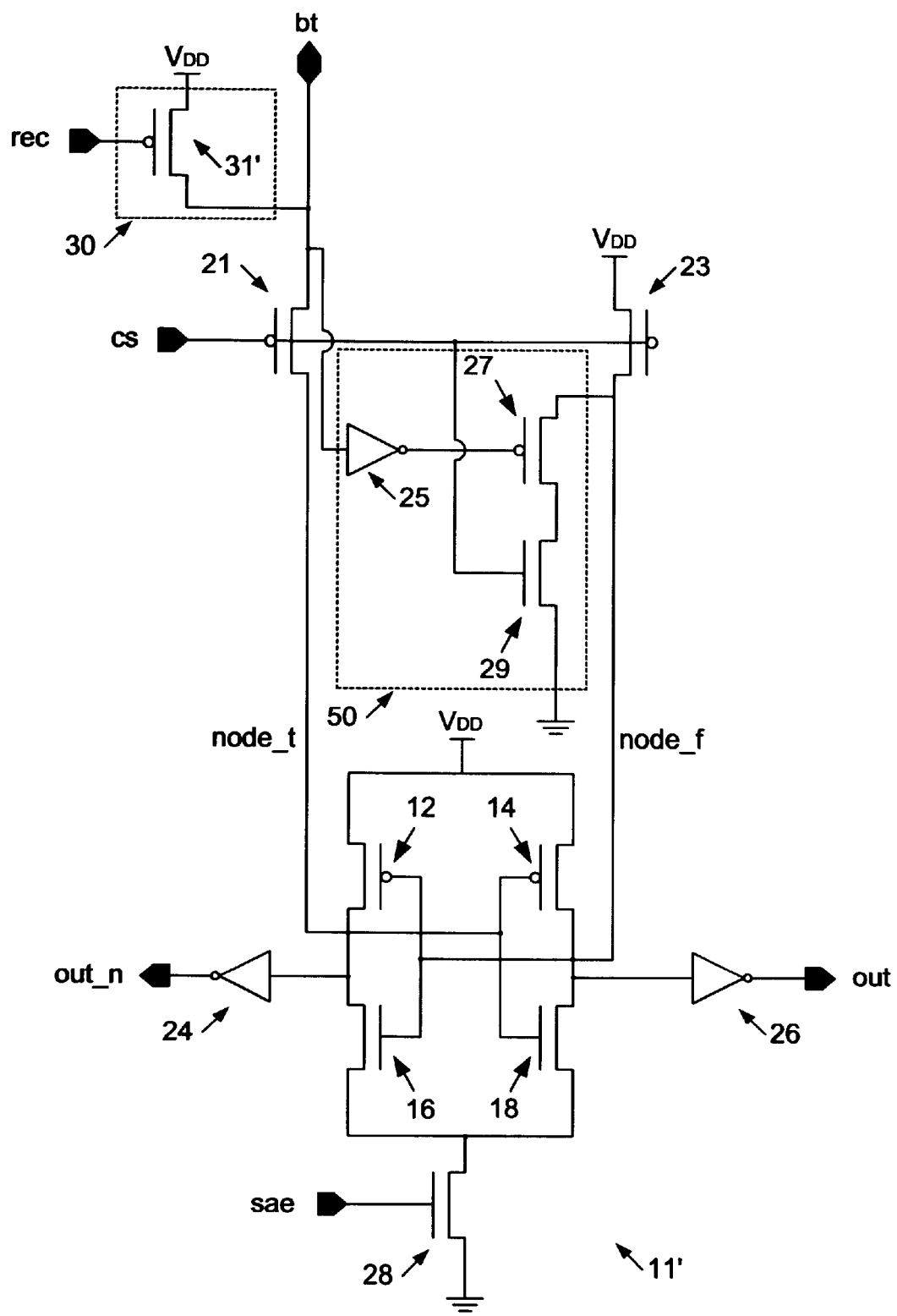
FIG. 3 is a circuit diagram of a single-input/dual-output sense amplifier in accordance with an embodiment of the present invention.

Referring to FIG. 3, a single-input/dual-output sense amplifier (11') in accordance with an embodiment of the present invention is shown. As can be seen, the circuit is essentially the same as that shown in FIG. 2. However, in the embodiment shown in FIG. 3, input bit-line signal (bt) is coupled directly to the inverter (25).

Those skilled in the art will appreciate that for the circuits shown in both FIG. 2 and FIG. 3, the column select signal (cs) and sense amplifier enable control signal (sae) can be realized so that a rising edge signal can enable transistor (28) by the sense amplifier enable control signal (sae) and, at the same time, shut off transistors (21) and (23) by the column select signal (cs). Then, the rising edge of the column select signal (cs) turns on transistor (29), which, in turn, readies the circuit to develop the voltage difference between node__t and node__f depending on the output of transistor (27).

Advantages of the present invention may include one or more of the following. In accordance with one or more embodiments, a single-input/dual-output sense amplifier senses only one input signal and provides dual outputs. The single-input/dual-output sense amplifier has comparable sensing speed to conventional differential sense amplifiers. The single input/dual output sense amplifier is particularly useful when the number of entries per bit-line is relatively small (typically, less than 32 entries). The single-input/dual-output sense amplifier has the advantages of a differential sense amplifier, but only requires a single input.

The gate capacitance of the recovery circuit is reduced to half of that of the conventional scheme. Because there is only one bit-line, the number of metal tracks, which are normally fully shielded, is reduced. In turn, the lower number of metal tracks brings a reduction in the chance of the circuit being exposed to noise. Also, circuit area is saved and the design allows for better circuit floor plans to be created.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A single-input/dual output sense amplifier comprising:
   cross-coupled transistors connected to a reference voltage;
   a first input transistor and a second input transistor connected to the cross-coupled transistors, wherein the first input transistor is coupled to a single input bit-line and the second input transistor is coupled to the reference voltage;
   an inverter receiving the input bit-line signal and outputting a complement of the input bit-line signal; and
   a control circuit coupled to the second input transistor and receiving the complement of the input bit-line signal, wherein the cross-coupled transistors produce dual differential outputs.

2. The single-input/dual output sense amplifier of claim 1, wherein the cross-coupled transistors comprise a first pmos transistor and second pmos transistor and a first nmos transistor and second nmos transistor.

3. The single-input/dual output sense amplifier of claim 1, further comprising:
   an enable transistor for enabling the cross-coupled transistors.

4. The single-input/dual output sense amplifier of claim 3, wherein the enable transistor is connected to ground and receives a sense amplifier enable control signal.

5. The single-input/dual output sense amplifier of claim 1, wherein the first input transistor and the second input transistor each receive a column select signal.

6. The single-input/dual output sense amplifier of claim 5, wherein the control circuit receives the column select signal.

7. The single-input/dual output sense amplifier of claim 1, wherein the first input transistor is a pmos transistor.

8. The single-input/dual output sense amplifier of claim 1, wherein the control circuit comprises a pair of transistors.

9. The single-input/dual output sense amplifier of claim 8, wherein the pair of transistors comprises a pmos transistor and a nmos transistor.

10. The single-input/dual output sense amplifier of claim 1, wherein each of the dual output signals is output through an inverter.

11. A method of producing dual differential output signals from a single input signal comprising:
   receiving a single input bit-line signal;
   inverting the received single input bit-line signal to produce a complement of the received single input bit-line signal;
   controlling the charging and discharging of a reference node based on the complement of the received input bit-line signal; and
   outputting dual differential output signals based on the single input bit-line signal and the reference node.

12. An apparatus for producing dual differential output signals from a single input signal, comprising:

means for receiving a single input bit-line signal;

means for inverting the received single input bit-line signal to produce a complement of the received single input bit-line signal;

means for controlling the charging and discharging of a reference node based on the complement of the received input bit-line signal; and means for outputting dual differential output signals based on the single input bit-line signal and the reference node.

13. A single-input/dual output sense amplifier comprising:

cross-coupled transistors connected to a reference voltage and enabled by an enable transistor, the cross-coupled transistors comprising a first pmos transistor and the second pmos transistor and a first nmos transistor and the second nmos transistor;

the enable transistor connected to ground and receiving a sense amplifier enable control signal;

a first input transistor and a second input transistor connected to the cross-coupled transistors and receiving a column select signal, wherein the first input transistor is coupled to a single input bit-line and the second input transistor is coupled to the reference voltage;

an inverter receiving the input bit-line signal and outputting a complement of the input bit-line signal; and a control circuit coupled to the second input transistor and receiving the complement of the input bit-line signal and the column select signal, wherein the cross-coupled transistors produce dual differential outputs.

14. The single-input/dual output sense amplifier of claim 13, wherein the first input transistor is a pmos transistor.

15. The single-input/dual output sense amplifier of claim 13, wherein the control circuit comprises a pair of transistors.

16. The single-input/dual output sense amplifier of claim 13, wherein the control circuit comprises a pmos transistor and a nmos transistor.

17. The single-input/dual output sense amplifier of claim 13, wherein each of the dual output signals is fed out of single-input/dual-output sense amplifier through an inverter.

* * * * *